United States Patent [19]

Sporon-Fiedler et al.

[11] Patent Number: 5,208,124
[45] Date of Patent: May 4, 1993

[54] METHOD OF MAKING A MASK FOR PROXIMITY EFFECT CORRECTION IN PROJECTION LITHOGRAPHY

[75] Inventors: Frederik Sporon-Fiedler, San Mateo; Nader Shamma, Los Altos; Edward Lin, Santa Clara, all of Calif.

[73] Assignee: Hewlett-Packard Company, Palo Alto, Calif.

[21] Appl. No.: 671,567

[22] Filed: Mar. 19, 1991

[51] Int. Cl.⁵ .............................. G03F 1/00
[52] U.S. Cl. ..................... 430/5; 430/296; 364/468; 378/35
[58] Field of Search ............ 430/5, 22, 296, 311, 430/320, 321; 364/468; 378/35; 250/492.1, 492.2, 492.3

[56] References Cited

U.S. PATENT DOCUMENTS

| | | | |
|---|---|---|---|
| 4,895,780 | 1/1990 | Nissen-Cohen | 430/5 |
| 4,902,899 | 2/1990 | Lin | 430/5 |

OTHER PUBLICATIONS

J. D. Cuthbert, "Optical Projection Printing," Solid State Technology, Aug. 1977, pp. 59-69.
J. H. Bruning, "Optical Imaging for Microfabrication," J. Vac. Sci. Technol., 17(5), Sep./Oct. 1980, pp. 1147-1155.

Primary Examiner—Marion E. McCamish
Assistant Examiner—Kathleen Duda

[57] ABSTRACT

Reticle data used to form a reticle pattern is modified to substantially compensate for proximity effects resulting from the diffraction of light by opaque portions of the reticle pattern.

The reticle pattern is thus modified so that the exposed pattern on the wafer results in a desired pattern, wherein isolated features and features in a dense pattern of features formed on the wafer will be identical and have predictable characteristics.

5 Claims, 6 Drawing Sheets

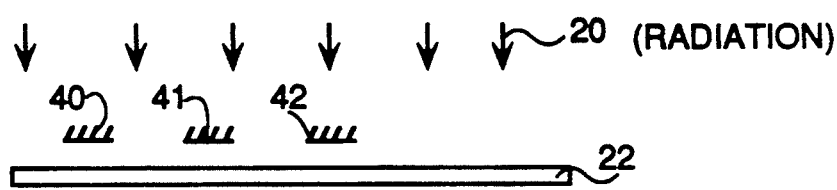
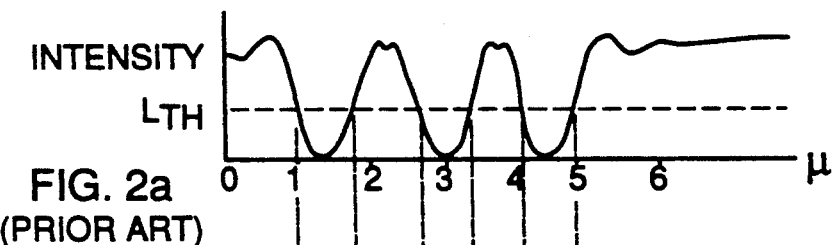
FIG. 2a
(PRIOR ART)
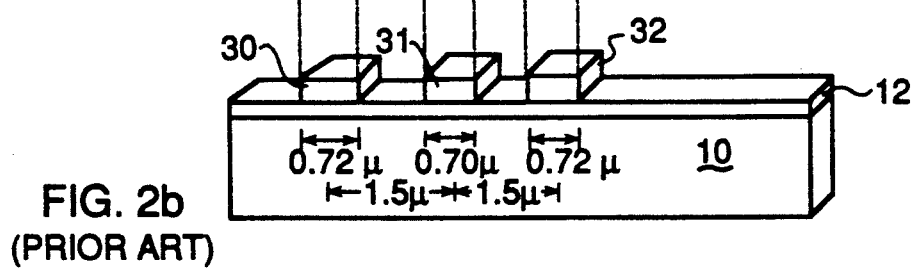
FIG. 2b
(PRIOR ART)

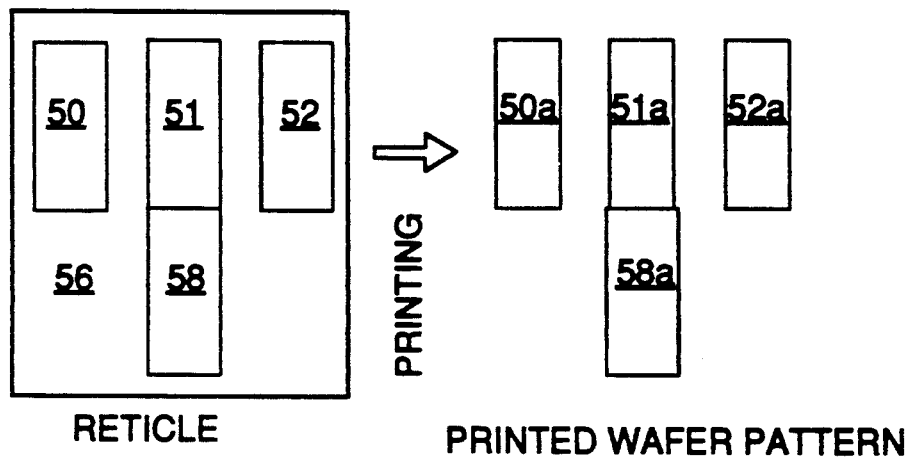
RETICLE
PRINTED WAFER PATTERN
FIG. 3a
(PRIOR ART)
FIG. 3b
(PRIOR ART)
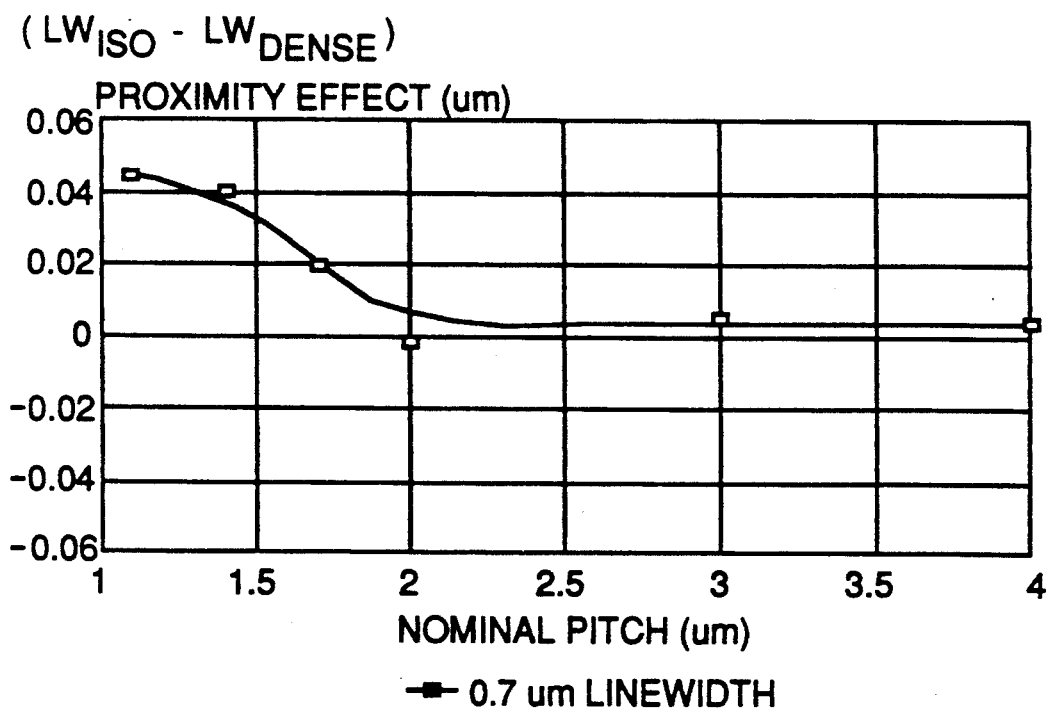
FIG. 4

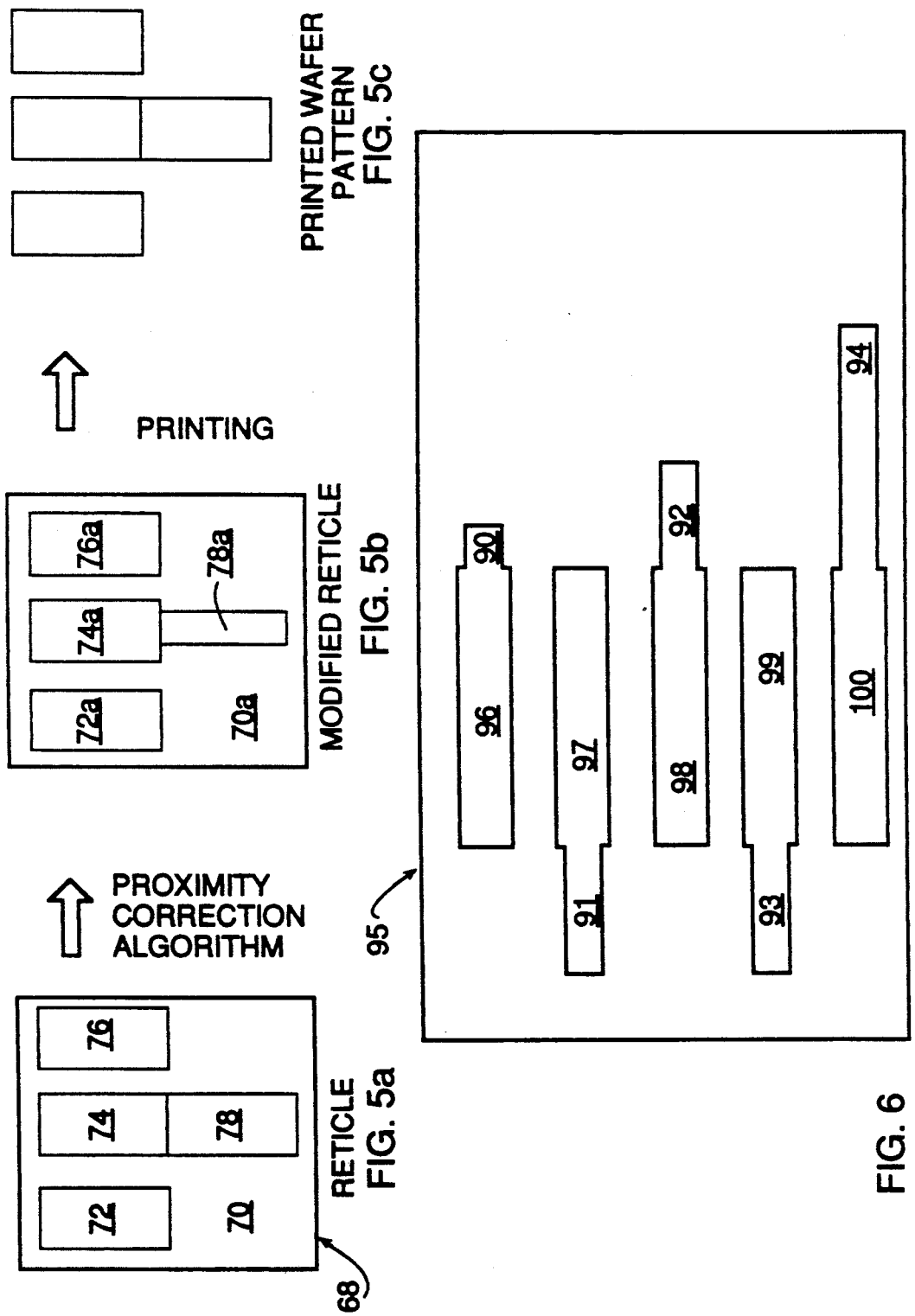

METHOD OF MAKING A MASK FOR PROXIMITY EFFECT CORRECTION IN PROJECTION LITHOGRAPHY

FIELD OF THE INVENTION

This invention relates to photolithography and, in particular, to mask pattern generation for projection photolithography.

BACKGROUND OF THE INVENTION

In photolithography, a light-opaque pattern imprinted on a mask or reticle is interposed between a radiation source and a photosensitive resist (photoresist) layer on a semiconductor wafer. Typically, the radiation source is a mercury lamp. If the photoresist polarity is positive, the unshaded or exposed portions of the photoresist are easily dissolved or otherwise removed in a subsequent development step. The unexposed portions of the positive photoresist remain polymerized and will not be removed during the development step.

If a negative photoresist is used, the exposed photoresist becomes polymerized and, hence, resistant to developer solutions, while the unexposed negative photoresist is easily dissolved by the developer solution.

After the photoresist is dissolved and removed, the resulting wafer uses the remaining patterned photoresist layer as a protective layer to, for example, block the deposition of dopants or to prevent etching of one or more layers underlying the remaining photoresist.

One type of projection photolithographic process uses a mask (containing the entire wafer pattern) which is spaced close to (e.g., 5 microns) the wafer. In this process, no lens system is required to focus the mask image onto the water surface.

Another type of projection photolithographic process uses a mask spaced away from the wafer, wherein a lens system interposed between the mask and wafer is used to focus the pattern of the mask onto the entire wafer.

An improved type of projection photolithographic process uses a reticle, which contains a pattern for a single die or a relatively small portion of the wafer. This process uses a stepper, wherein the reticle is mounted typically 50 centimeters to 1 meter from the wafer, and a lens system focuses the reticle pattern on a small portion of the wafer to expose the photoresist. The wafer is then slightly shifted relative to the reticle image, and the exposure process is repeated until substantially the entire wafer has been exposed by the same reticle in a repeated pattern.

As is well known, a major limiting factor in image resolution when using any of the above-described projection photolithographic processes is the diffraction of light, wherein light is bent around the mask or reticle pattern. Due to diffraction, the mask or reticle pattern is slightly distorted when the pattern image is projected onto the wafer surface.

Applicants have discovered that, with conventional projection photolithographic methods using conventional masks and reticles, line widths of lines within a dense pattern of lines formed on a wafer surface are narrower than line widths of isolated lines, even though all line widths on the mask or reticle are identical. Such is the case where a positive photoresist is used and the opaque portions of the mask or reticle correspond to the lines and other features to be formed on the wafer surface. Where a negative photoresist is used, causing the clear portions of the mask or reticle to correspond to the lines and other features formed on the water surface, the effect would be opposite.

Thus, the resulting wafer contains feature sizes that are dependent upon whether a feature is isolated or within a dense pattern. This results in unpredicted feature sizes. One skilled in the art of integrated circuit design will be aware of the various problems which may result from unpredicted feature sizes, such as differing electrical characteristics between the formed conductive lines where the lines were designed to have identical electrical characteristics.

The reason for this discrepancy in line widths of lines within a dense pattern and isolated lines is illustrated in FIGS. 1-3. It is to be noted that this discrepancy exists with all geometric shapes and not just lines.

FIGS. 1 and 2 illustrate a simple metalization process.

Initially, wafer 10, shown in FIG. 1b, has formed over its surface an unpatterned layer of silicon dioxide 12. Metal layer 14, typically aluminum, is then deposited on the surface of wafer 10 using conventional techniques. A layer of positive photoresist is then spun onto the surface of the wafer to completely coat the surface of the wafer. Using well-known techniques, the wafer surface is then selectively exposed to radiation through a reticle.

FIG. 1a shows a reticle pattern represented by light blocking portions 16 and 18, which block light generated by a well-known type of lamp used to expose photoresist. Downward arrows represent partially coherent radiation 20 from the lamp. Lens 22 focuses the image of the reticle onto the surface of wafer 10. The X axis of the graph in FIG. 1a represents the distance along the wafer 10 surface, and the Y axis of the graph represents the resulting light intensity on the wafer 10 surface.

As seen by the intensity of light impinging upon the wafer surface, a certain low level of light intensity exists under light blocking portions 16 and 18 due to the diffraction of light, whereby the light waves traveling in straight paths bend around light blocking portions 16 and 18. Thus, additional area of the photoresist is exposed to light due to the diffraction of light. Further, it is seen at the edges of the shaded areas on the surface of wafer 10 that the light waves from radiation 20 have constructively and destructively interfered with one another as a result of the diffraction of light. Hence, where the light intensity is increased due to constructive interference, the photoresist will be even more exposed. The extent of these edge effects is a function of light coherency, numerical aperture of the lens used, and other factors, as discussed in the publications: "Optical Projection Printing," by J. D. Cuthbert, Solid State Technology, Aug. 71; and, "Optical Imaging for Microfabrication," by J. H. Bruning, Journal of Vacuum Science Technology, 17(5), Sept./Oct. 80; both incorporated herein by reference.

It is assumed for purposes of illustration that any photoresist exposed to light above a threshold intensity level $L_{TH}$ will be dissolved away during development of the photoresist. In actuality, this distinction between exposed and unexposed photoresist is not as precisely defined. This threshold light intensity level is represented on the Y axis of FIG. 1a by $L_{TH}$.

FIG. 1b shows wafer 10 after being sufficiently exposed to the light pattern and after the exposed photoresist has been removed. Photoresist portions 24 remain.

In this example, the width of photoresist portions 24 is 0.74 microns.

Shown in FIG. 1c, exposed metal layer 14 is anisotropically etched, using well-known techniques, and photoresist portions 24 are removed with a photoresist stripper. The remaining oxide 12 may then be removed if desired.

Thus, what remains is a metal pattern shown in FIG. 1c, comprising parallel metal lines 26 and 28, whose geometries are dictated by the geometries of light blocking portions 16 and 18 and by the spaces between the light blocking portions. The width of light blocking portions 16 and 18 corresponds to metal line widths of 0.74 microns in FIG. 1c. In the example of FIG. 1c, the pitch or distance between the centers of metal lines 26 and 28 is three microns.

In the example of FIG. 1, the pitch of three microns for parallel metal lines 26 and 28 results in an isolated pattern of lines, since the diffraction effect from light blocking portion 16 does not influence the shape of metal line 28, and the diffraction effect from light blocking 18 does not influence the shape of metal line 26.

FIG. 2b shows a dense pattern of metal lines, wherein the pitch between metal lines 30, 31, and 32 is 1.5 microns. As will be seen in the example of FIG. 2, the resulting widths of metal lines 30, 31, and 32 are less than 0.74 microns, even though the widths of light blocking portions 40-42 of the reticle shown in FIG. 2a are identical to the widths of light blocking portions 16 and 18 in FIG. 1a. This is because light blocking portions 40-42 are situated sufficiently close to one another such that the diffraction effects from light blocking portions 40 and 42 cause a greater area of photoresist under center light blocking portion 41 to be exposed above the threshold intensity $L_{TH}$. Also, the diffraction effects from light blocking portion 41 cause a greater area of photoresist under light blocking portions 40 and 42 to be exposed above $L_{TH}$.

As seen, metal line 31 is narrower than metal lines 30 and 32, since the line width of metal line 31 is reduced on both sides by the diffraction effects of light blocking portions 40 and 42.

The above-described process is merely illustrative of the effect of the diffraction of light inherent in a projection-type photolithographic process. The drawbacks of prior art photolithographic processes stemming from the diffraction effect are in no way limited to the above-described specific process used to form a metalization pattern.

Shown in FIG. 3a is a top view of a simple reticle pattern, wherein rectangles 50, 51, and 52 define opaque portions of the reticle, and portion 56 defines a clear portion. The pattern (highly magnified) transferred to the surface of a wafer is shown in FIG. 3b, where metal lines 50a, 51a, and 52a result from opaque portions 50, 51, and 52, respectively. For purposes of this example, the close proximity of opaque portions 50, 51, and 52 cause lines 50a, 51a, and 52a to be slightly narrowed, similar to that effect illustrated in FIGS. 2a and 2b. For this reason, the resulting pattern of lines 50a, 51a, and 52a is classified as a dense pattern of lines.

Also shown in FIG. 3a is opaque portion 58, which produces metal line 58a in FIG. 3b. Since, there is no influence from adjacent opaque portions, there is no narrowing effect on line 58a. For this reason, line 58a is classified as an isolated line.

Shown in FIG. 4 is a graph illustrating the difference in width between an isolated line ($LW_{ISO}$) of 0.7 microns and a line in a dense pattern of lines ($LW_{DENSE}$) for a range of pitches, wherein the isolated line and the line in the dense pattern have identical line width geometries on the reticle. This difference in line width stems from what is termed the proximity effect. As seen from FIG. 4, this proximity effect becomes significantly pronounced for pitches less than two microns for line widths of approximately 0.7 microns. For example, at a pitch of 1.5 microns, the isolated line width is 0.7 microns, while the line width in a dense pattern is approximately 0.67 microns. As the state of the art in this field progresses, line widths and pitches will be continually reduced, further compounding the disadvantageous effects of isolated lines being formed wider than lines in a dense pattern.

Thus, what is needed in the field of photolithography is a method to correct for this proximity effect so that a mask or reticle produces the intended pattern on the wafer.

SUMMARY OF THE INVENTION

In accordance with the invention, to compensate for the difference in line widths between isolated lines and lines in a dense pattern of lines, the mask or reticle pattern itself is modified so that the exposed pattern on the wafer results in the desired pattern. This invention applies equally to all mask or reticle geometries, not just lines.

For example, using a positive photoresist and where the unexposed photoresist substantially defines conductive lines to be formed on the wafer, a reticle is modified in accordance with one embodiment of the invention so that the opaque portions of the reticle for forming isolated lines are made slightly narrower than the opaque portions for forming lines in the dense pattern of lines.

Due to the previously described proximity effect, a dense pattern of opaque portions on a reticle will form narrower line widths than an isolated pattern of opaque portions on the reticle Since the difference in line widths between isolated lines and lines in a dense pattern of lines has been compensated for in the mask or reticle pattern itself, the resulting isolated line widths on the wafer will be equal to the line widths of lines in a dense pattern on the wafer.

The mask or reticle pattern is modified in the preferred embodiment of the invention using a software program containing a series of logic steps. The program manipulates the mask or reticle data, which is then used to automatically fabricate the mask or reticle pattern using conventional mask fabricating equipment.

BRIEF DESCRIPTION OF THE DRAWINGS

FIGS. 1a, 1b, 1c, 2a and 2b illustrate the difference in line widths of lines formed in a dense pattern of lines and isolated lines.

FIGS. 3a and 3b is a top view of a conventional reticle and the resulting wafer pattern formed with the conventional reticle.

FIG. 4 is a graph showing the difference in widths between isolated lines and lines within a dense pattern of lines for a range of pitches.

FIGS. 5a, 5b and 5c illustrates a reticle pattern which is modified in accordance with the present invention to compensate for the proximity effect.

FIGS. 6 and 7 illustrate other examples of modified reticle patterns in accordance with the present invention.

DETAILED DESCRIPTION OF THE PREFERRED EMBODIMENT

Figure 1A:
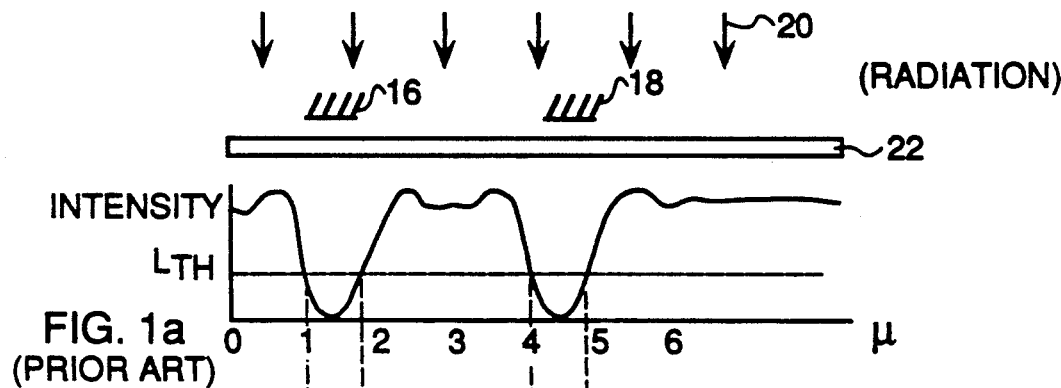
Figure 1B:
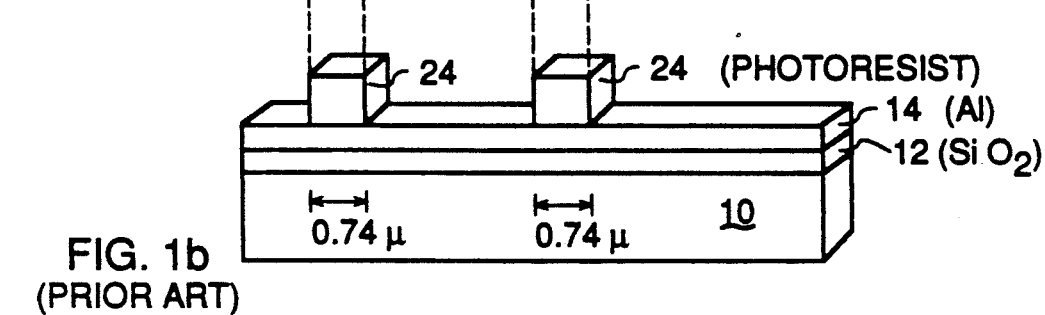
Figure 1C:
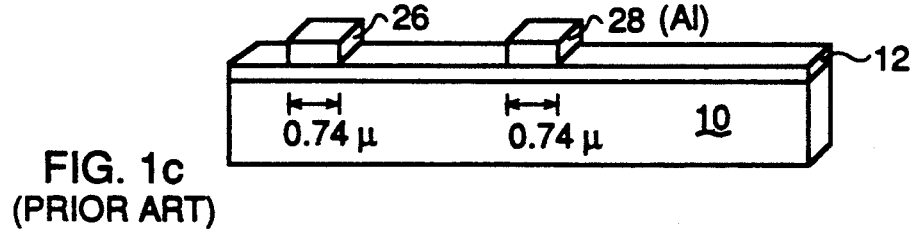

In FIG. 5a, the clear portion of reticle 68 is shown as 70, and the opaque portions of reticle 68 are shown as rectangular portions 72, 74, 76, and 78. The reticle pattern defined by opaque portions 72, 74, and 76 is, for purposes of illustration, considered a dense pattern, and the reticle pattern defined by opaque portion 78 is considered an isolated portion.

As previously described, the resulting dense pattern of lines formed on a wafer surface will be narrowed in width due to the proximity effect, illustrated by the graph of FIG. 4, and the isolated lines will not be affected by the proximity effect. Without modification of the conventional reticle data, the resulting wafer pattern will resemble that shown in FIG. 3b.

To avoid the undesirable wafer pattern of FIG. 3b, the reticle data is modified to create the modified reticle pattern shown in FIG. 5b. The reticle pattern of FIG. 5b maintains the original dense pattern, comprising opaque portions 72a, 74a, and 76a, but has a modified isolated pattern, wherein the opaque portion 78a is made narrower than the corresponding portion 78 of FIG. 5a.

The amount portion 78a is made narrower than portion 78 is dependent upon the line width (or feature size) and pitch. For example, the graph of FIG. 4 may be used to determine the necessary narrowing of portion 78a where the line width of isolated lines formed on the wafer is 0.7 microns.

Using the modified reticle of FIG. 5b, the resulting exposed pattern on the surface of the wafer will resemble that shown in FIG. 5c, which is the desired pattern and that pattern which corresponds to the original reticle of FIG. 5a.

It will be understood by those of ordinary skill in the art after reading this disclosure that the same advantageous results of Applicants' below described process can be identically achieved by either widening opaque portions 72, 74, and 76, or narrowing opaque portion 78. Further, this invention applies to any geometry, not just lines.

It will be further understood by those of ordinary skill in the art that using a negative photoresist will cause the previously described proximity effect to have opposite consequences, since lines will be formed on a wafer where the photoresist is exposed. In such a case, the isolated lines on the wafer will be formed narrower than lines within a dense pattern of lines. Hence, the reticle data is to be adjusted as appropriate in light of the particular wafer fabrication process used.

For purposes of illustration and simplicity, the example of FIG. 5 and the more detailed process described below contemplate a positive photoresist be used in the line forming process, and where the unexposed portion of the photoresist corresponds to the formation of conductive lines on the surface of the wafer.

Figure 7:
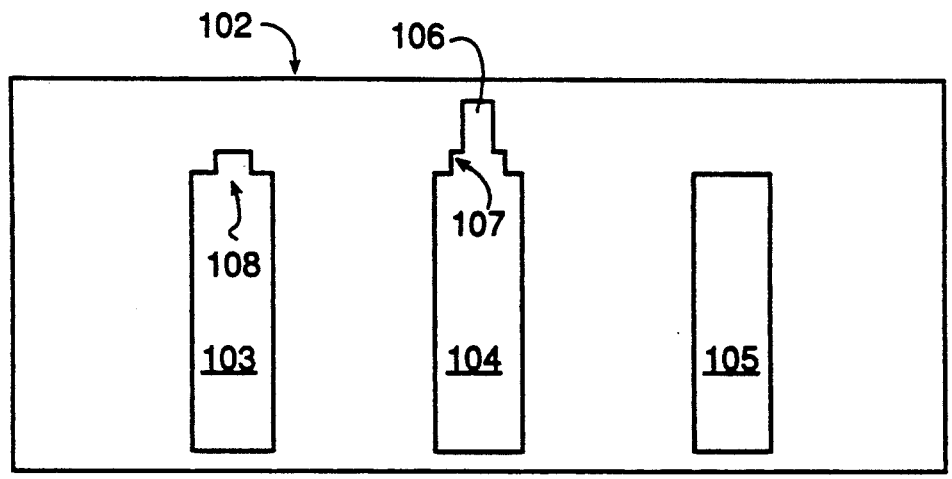

FIGS. 6 and 7 illustrate other general examples of reticle patterns modified in accordance with this invention.

In FIG. 6, it is seen that opaque portions 90-94 of reticle 95, which are considered to be isolated, are made narrower than opaque portions 96-100, which are considered to be part of a dense pattern and thus subject to the proximity effect. Due to the proximity effect inherent in projection photolithography, the resulting lines on a wafer formed with the reticle of FIG. 6 will have a uniform width along their entire length.

FIG. 7 illustrates a modified reticle pattern where three different lengths of opaque portions of reticle 102 are modified to compensate for the proximity effect. The larger width opaque portions 103, 104, and 105 are deemed to be part of a dense pattern and subject to the proximity effect. Opaque portion 104 has a length greater than that of opaque portions 103 and 105 and, thus, has a portion 106 of its length not affected by the proximity effect. Accordingly, isolated portion 106, extending from portion 104, is made narrower Opaque portion 107, also extending from portion 104, however, is subject to the proximity effect on only one side; thus, the width of portion 107 is only slightly reduced from that of portion 104. The identical environment surrounds opaque portion 108 and, thus, opaque portion 108 is only slightly reduced in width from opaque portion 103. As seen, a single opaque portion may have varying widths depending upon its environment.

The state of the art in creating a mask or a reticle is to first develop a desired electrical circuit using one of many well-known computer-aided design (CAD) programs. The mask designer then implements this circuit design using a different CAD program which enables the mask designer to form the desired circuit as P and N type diffused regions in a semiconductor wafer in combination with various layers of insulation, conductors, gates, and other structures which may be formed in an integrated circuit fabrication process. Generally, each layer formation and diffusion step is implemented using a separate mask. The mask designer, after determining the mask patterns required to create the desired circuit, transfers the mask or reticle data, which represents the mask or reticle pattern, directly or by means of a data storage means to an automated mask producing apparatus, which, in turn, converts the mask or reticle data into a chrome pattern on a glass mask or reticle plate.

Figure 8:
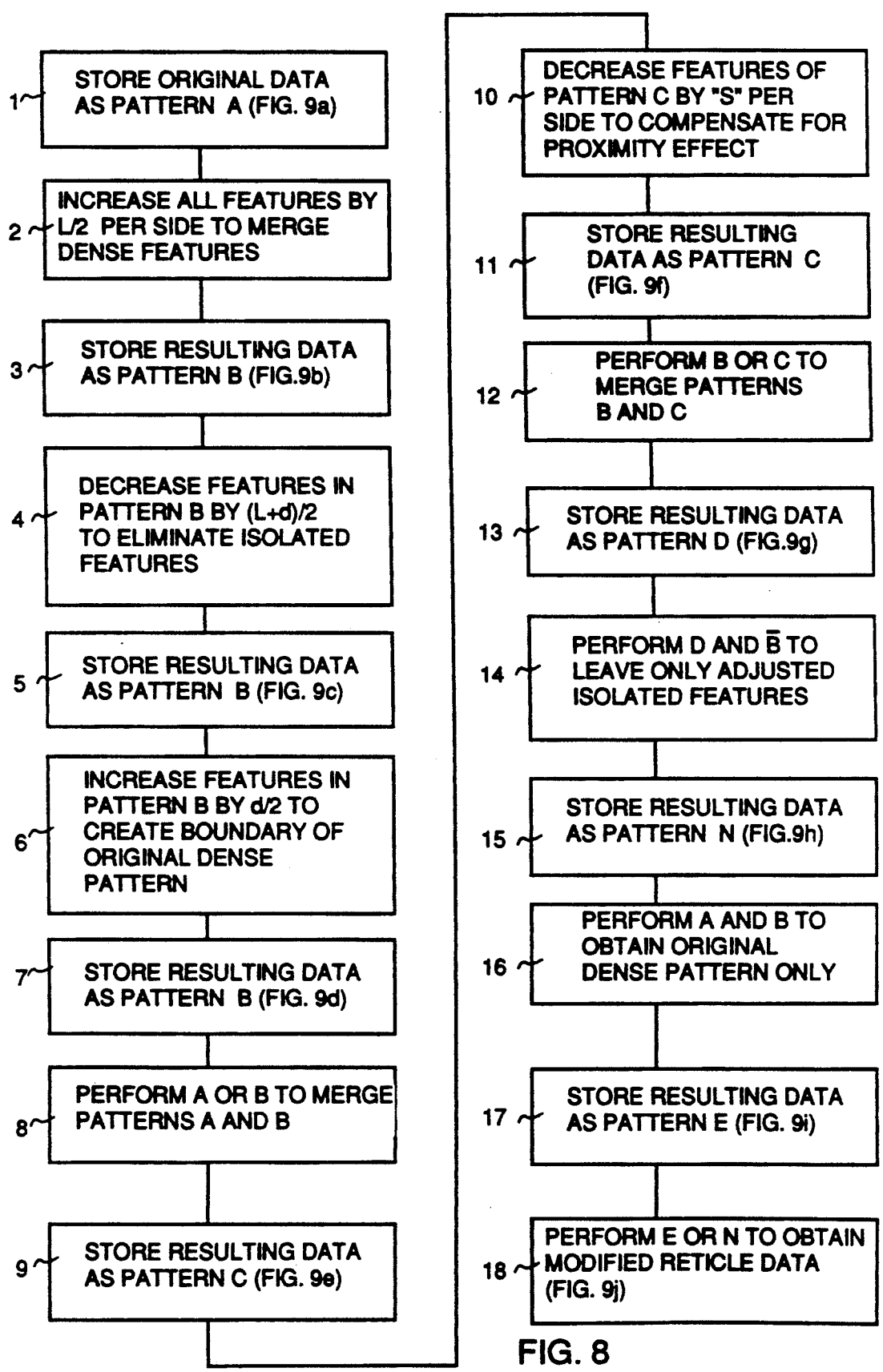
FIG. 8 illustrates a flow chart of the preferred embodiment of the invention.

In one embodiment of the invention, Applicants use the specific method described below and shown in the flow chart of FIG. 8 to modify the mask or reticle data. The flow chart of FIG. 8 is only one embodiment of the many methods which may be used to carry out the inventive process. The flow chart of FIG. 8 is easily implemented in software by one of ordinary skill in the art.

The below process assumes that the photoresist is of the positive type and that the unexposed portions of the wafer generally correspond to a metalization pattern or other conductive pattern. With negative resist, or with other types of processes for forming the metalization pattern, the reticle data associated with isolated features or a dense pattern of features will be modified as appropriate to compensate for the proximity effect.

In the below described process, the dimensions of reticle features in isolated patterns are reduced to eliminate differences between isolated features and features within a dense pattern due to the proximity effect. Line widths of 0.7 microns are presumed for this example.

Figure 9:
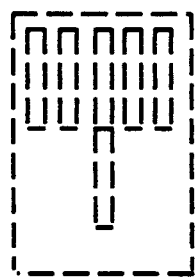
FIGS. 9a, 9b, 9c, 9d, 9e, 9f, 9g, 9h, 9i and 9j illustrates the various modifications made to an original reticle pattern as the process illustrated in FIG. 8 is carried out on the original reticle data.
Figure 9:
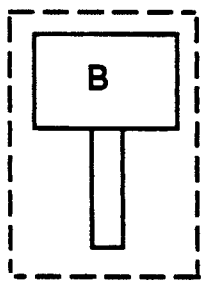
Figure 9:
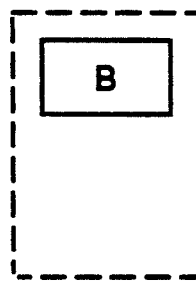
Figure 9:
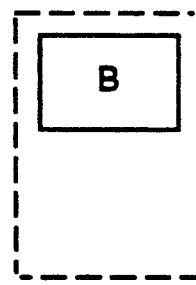
Figure 9:
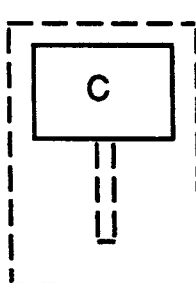
Figure 9:
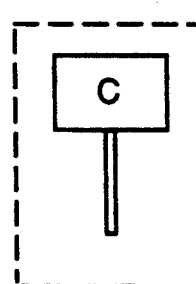
Figure 9:
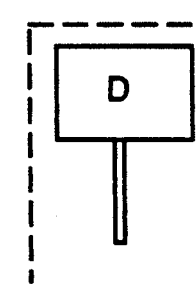
Figure 9:
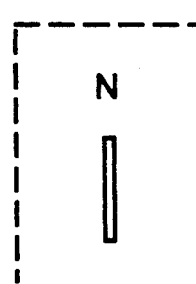
Figure 9:
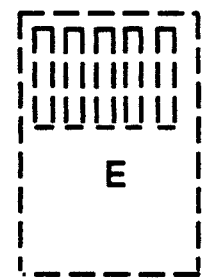
Figure 9:
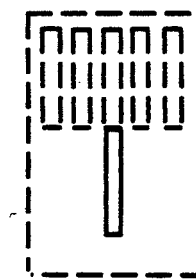

In step 1 of the flow chart of FIG. 8, the original reticle pattern shown in FIG. 9a, corresponding to the reticle data, is stored as pattern A. (Original features will be shown in dashed outline.)

In step 2, all features of the original reticle pattern shown in FIG. 9a are modified to be oversized on all sides by L/2, where L equals the spacing between features which classify the features as being within a dense pattern. In this example, L equals 0.8 microns. Since L/2 in this case will be equal to 0.4 microns, this serves to merge all adjacent features with spacings less than or equal to 0.8 microns For line widths of 0.7 microns, this value of L coincides with a pitch of 1.5 microns. As seen from the graph of FIG. 4, any adjacent features which would be merged would be significantly affected by the proximity effect. Thus, step 2 serves to merge all features within a dense pattern. The resulting pattern is shown in FIG. 9b.

In step 3, the new, oversized pattern (FIG. 9b) is stored as pattern B.

In step 4, all sides of the features of the stored pattern B are decreased by (L+d)/2, where d equals the feature size. In this example, the feature size, or line width, is considered to be 0.7 microns. This step 4 cancels the increase in feature size from step 2 and additionally serves to eliminate all isolated features, as shown in FIG. 9c.

In step 5, the resulting pattern of FIG. 9c is stored as pattern B.

In step 6, all features of pattern B are increased by d/2 to offset the reduction in size of the dense pattern from step 4, so that now the rectangle pattern shown in FIG. 9d precisely bounds the dense pattern of the original reticle pattern of FIG. 9a.

In step 7, this new pattern of FIG. 9d is stored as pattern B.

In step 8, the original pattern A is logically ORed with pattern B to effectively merge patterns A and B. The merged pattern resembles that of FIG. 9e.

In step 9, the pattern of FIG. 9e is stored as pattern C.

In step 10, pattern C is decreased uniformly by s microns, which is that amount needed to reduce the size of the isolated features to eliminate differences in resulting feature sizes due to the proximity effect. In this example, s is 0.02 microns in accordance with the graph of FIG. 4, since at a pitch of approximately 1.5 microns, the isolated features must be decreased by approximately 0.02 microns per side (totalling 0.04 microns) to eliminate differences in resulting feature sizes due to the proximity effect.

Since this factor s is dependent upon pitch and feature size (i.e., d), this factor s will be different when compensating for the proximity effect with other pitches and feature sizes. One of ordinary skill in the art, given the process disclosed herein, will be able to determine this tweaking factor s for any pitch and feature size after developing graphs similar to that shown in FIG. 4 for various feature sizes.

In step 11, the pattern generated in step 10 is now stored as pattern C, shown in FIG. 9f.

In step 12, pattern B, shown in FIG. 9d, is ORed with pattern C of FIG. 9f and stored as pattern D in step 13. Pattern D is shown in FIG. 9g.

In step 14, pattern D is ANDed with the inverse of pattern B (i.e., $\bar{B}$) so as to leave remaining only the isolated pattern, slightly reduced in size by s microns. This resulting pattern is stored as pattern N in step 15 and is shown in FIG. 9h.

In step 16, the original pattern A is ANDed with pattern B, shown in FIG. 9d, to reproduce the original dense pattern only. This resulting pattern is stored as pattern E in step 17 and is shown in FIG. 9i.

In step 18, pattern E is ORed with the tweaked isolated pattern N to merge the original dense pattern with the tweaked isolated pattern. This resulting pattern is shown in FIG. 9j and is the resulting reticle data which will then be used to create a physical reticle pattern.

As will be apparent to one of ordinary skill in the art, many other simple routines may also be used to achieve the same results. In a preferred embodiment, the process described with respect to the flow chart of FIG. 8 would be a recursive procedure which would repeat for various feature sizes and pitches employed in the reticle pattern, wherein the values of L, d, and s will be changed accordingly to compensate for the proximity effect associated with a particular feature size and pitch. The magnitude of the proximity effect as a function of a particular feature size and pitch is best determined empirically, since the particular characteristics of the stepper, light source, photoresist, and wafer fabrication process parameters used will influence the extent of the proximity effect.

Thus, a preferred embodiment for carrying out the invention has been disclosed. The results of Applicants' inventive method become more and more advantageous as feature sizes and pitches are reduced.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for manufacturing a mask or reticle for use in a fabrication process, wherein said mask or reticle is compensated for proximity effects, said method comprising the steps of:

generating original mask or reticle data corresponding to an original mask or reticle pattern;

adjusting said original mask or reticle data to produce a modified mask or reticle pattern which compensates for anticipated differences in features sizes between isolated features on a surface subjected to masked radiation and features within a dense pattern of features on said surface due to said proximity effects, said isolated features being not substantially affected by said proximity effects, wherein said step of adjusting comprises adjusting said original mask or reticle data to reduce a size of one or more opaque portions of said original mask or reticle pattern associated with said isolated features, with respect to opaque portions associated with features within said dense pattern of features, to compensate for differences between feature sizes due to said proximity effects; and producing a mask or reticle having a pattern corresponding to said modified mask or reticle pattern.

2. The method of claim 1 further comprising, after said step of generating, the step of changing said original mask or reticle data to effectively merge features deemed to be substantially affected by said proximity effects so as to isolate and identify those features represented by said original mask or reticle data which are not substantially affected by said proximity effects.

3. The method of claim 2 wherein said step of adjusting comprises adjusting said original mask or reticle data associated with said features not substantially affected by said proximity effects.

4. The method of claim 1, wherein said step of adjusting comprises the steps of:

(1) storing said original mask or reticle data as a first pattern;

(2) increasing all features of said first pattern represented by said original mask or reticle data by an amount sufficient to merge said features of said first pattern associated with dense patterns, and storing this resulting pattern as a second pattern;

(3) decreasing all features in said second pattern by the same amount which said features were increased in step (2) and further decreasing these features by an amount sufficient to eliminate features which are considered to be associated with isolated patterns, and storing this resulting pattern as a third pattern;

(4) increasing all features of said third pattern by the same amount said features were decreased in step (3), and storing the resulting pattern as a fourth pattern;

(5) merging said first pattern and said fourth pattern, and storing the resulting pattern as a fifth pattern;

(6) decreasing all features of said fifth pattern by an amount to substantially compensate for the difference between the sizes of features formed on said surface due to said proximity effects and storing this resulting pattern as a sixth pattern;

(7) merging said fourth pattern with said sixth pattern, and storing this resulting pattern as a seventh pattern;

(8) logically ANDing said seventh pattern with an inverse of said fourth pattern so that only adjusted isolated patterns remain, and storing this resulting pattern as an eighth pattern;

(9) logically ANDing said first pattern and said fourth pattern, and storing this resulting pattern as a ninth pattern; and

(10) merging said ninth pattern with said eighth pattern to obtain the desired mask or reticle data.

5. An improved mask or reticle for forming features on a surface in a fabrication process to compensate for proximity effects, said improved mask or reticle comprising:

a mask or reticle having a pattern whose dimensions are adjusted to compensate for differences between feature sizes due to said proximity effects when said pattern is projected onto said surface, wherein said dimensions are adjusted to reduce a size of opaque portions in said pattern which form isolated features on said surface which are substantially unaffected by said proximity effects.

* * * * *